(12) United States Patent
Hsieh et al.

(10) Patent No.: US 8,853,937 B2
(45) Date of Patent: Oct. 7, 2014

(54) WAVELENGTH CONVERSION STRUCTURE, MANUFACTURING METHOD THEREOF, AND LIGHT-EMITTING DEVICE COMPRISING THE WAVELENGTH CONVERSION STRUCTURE

(75) Inventors: Min-Hsun Hsieh, Hsinchu (TW); Steve Meng-Yuan Hong, Hsinchu (TW); Yi-Jui Huang, Hsinchu (TW); Ming-Chi Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/588,005

(22) Filed: Aug. 17, 2012

(65) Prior Publication Data

US 2013/0043786 A1 Feb. 21, 2013

(30) Foreign Application Priority Data

Aug. 19, 2011 (TW) .............................. 100129943 A

(51) Int. Cl.
- H01J 1/62 (2006.01)
- H01J 63/04 (2006.01)
- B32B 9/04 (2006.01)
- H05B 33/10 (2006.01)
- B32B 5/16 (2006.01)
- H01L 33/50 (2010.01)

(52) U.S. Cl.
CPC ............ *B32B 5/16* (2013.01); *H01L 2933/0041* (2013.01); *B32B 9/04* (2013.01); *H01L 33/508* (2013.01); *H05B 33/10* (2013.01)
USPC ........... 313/506; 313/483; 427/157; 428/323; 257/98

(58) Field of Classification Search
USPC .................. 313/483, 506; 427/157; 428/323; 257/98
See application file for complete search history.

(56) References Cited

U.S. PATENT DOCUMENTS

| | | | | |
|---|---|---|---|---|
| 6,501,091 B1 * | 12/2002 | Bawendi et al. | ................. | 257/14 |
| 6,791,259 B1 * | 9/2004 | Stokes et al. | ................. | 313/503 |
| 6,960,878 B2 * | 11/2005 | Sakano et al. | ................. | 313/512 |
| 7,342,357 B2 * | 3/2008 | Sakano et al. | ................. | 313/512 |
| 7,385,349 B2 * | 6/2008 | Daicho et al. | ................. | 313/512 |
| 7,550,096 B2 * | 6/2009 | Sakano et al. | ......... | 252/301.4 R |
| 7,750,359 B2 * | 7/2010 | Narendran et al. | ............. | 257/98 |
| 7,795,625 B2 * | 9/2010 | Suzuki | ............. | 257/81 |
| 7,834,953 B2 * | 11/2010 | Park et al. | ........ | 349/62 |
| 7,910,940 B2 * | 3/2011 | Koike et al. | ..................... | 257/98 |
| 8,288,936 B2 * | 10/2012 | Ohta et al. | ..................... | 313/503 |
| 8,394,654 B2 * | 3/2013 | Aliyev | ............. | 438/29 |
| 8,415,692 B2 * | 4/2013 | Le Toquin | ............. | 257/98 |
| 2002/0140338 A1 * | 10/2002 | Sluzky | ............. | 313/461 |
| 2003/0080341 A1 * | 5/2003 | Sakano et al. | ............. | 257/79 |
| 2005/0117320 A1 * | 6/2005 | Leu et al. | ............. | 362/31 |
| 2005/0224821 A1 * | 10/2005 | Sakano et al. | ............. | 257/79 |
| 2006/0226759 A1 * | 10/2006 | Masuda et al. | ............. | 313/486 |
| 2006/0244358 A1 * | 11/2006 | Kim et al. | ............. | 313/486 |
| 2006/0291226 A1 * | 12/2006 | Daicho et al. | ............. | 362/509 |
| 2007/0228949 A1 * | 10/2007 | Maruyama et al. | ........... | 313/512 |
| 2008/0099727 A1 * | 5/2008 | Sakano et al. | ......... | 252/301.4 H |
| 2008/0230796 A1 * | 9/2008 | Ho et al. | ............. | 257/98 |

(Continued)

*Primary Examiner* — Thomas A Hollweg

(74) *Attorney, Agent, or Firm* — Ditthavong & Steiner, P.C.

(57) ABSTRACT

A wavelength conversion structure comprises a first phosphor layer and a second phosphor layer formed on the first phosphor layer, wherein the first phosphor layer comprises a plurality of first phosphor particles, and the second phosphor layer comprises a plurality of second phosphor particles. The average particle size of the second phosphor particles is not equal to that of the first phosphor particles.

17 Claims, 2 Drawing Sheets

(56) References Cited

U.S. PATENT DOCUMENTS

| | | | |
|---|---|---|---|
| 2008/0231170 A1* | 9/2008 | Masato et al. | 313/501 |
| 2009/0014741 A1* | 1/2009 | Masuda et al. | 257/98 |
| 2009/0242921 A1* | 10/2009 | Aliyev | 257/98 |
| 2009/0256166 A1* | 10/2009 | Koike et al. | 257/98 |
| 2009/0278147 A1* | 11/2009 | Suzuki | 257/98 |
| 2010/0013375 A1* | 1/2010 | Maruyama et al. | 313/502 |
| 2010/0051982 A1* | 3/2010 | Lin et al. | 257/98 |
| 2010/0117530 A1* | 5/2010 | Lin et al. | 313/512 |
| 2012/0217865 A1* | 8/2012 | Cabalu et al. | 313/483 |

* cited by examiner

WAVELENGTH CONVERSION STRUCTURE, MANUFACTURING METHOD THEREOF, AND LIGHT-EMITTING DEVICE COMPRISING THE WAVELENGTH CONVERSION STRUCTURE

TECHNICAL FIELD

The application relates to a wavelength conversion structure and a manufacturing method thereof, and more particularly, to a wavelength conversion structure having high light extraction efficiency and a manufacturing method thereof, and a light-emitting device comprising the wavelength conversion structure.

REFERENCE TO RELATED APPLICATION

This application claims the right of priority based on Taiwan application Serial No. 100129943, filed on Aug. 19, 2011, and the content of which is hereby incorporated by reference in its entirety.

DESCRIPTION OF BACKGROUND ART

In recent years, the energy problem is gradually taken seriously, and thus kinds of new energy-saving lightings have been developed. Among them, the light-emitting diode (LED) has advantages of high luminous efficiency, less power consumption, mercury-free and long lifetime, which has become a promising lighting source in the next generation.

With the use of phosphor and LED chip, the yellow phosphor, YAG (Yttrium Aluminum Garnet, $Y_3Al_5O_{12}$), is excited by the blue LED chip to emit the yellow light, and the blue light of the LED chip complements the yellow light of YAG-based phosphor to emit the white light.

The method for coating the phosphor on the LED comprises conformal coating and remote phosphor. The method of conformal coating is performed by directly coating the phosphor on the LED chip to form a phosphor layer. The method of conformal coating has the advantage of uniform thickness. But the light emitted from the phosphor layer is absorbed by the LED chip and the support substrate, and the overall luminous efficiency of the LED is reduced. In addition, because the phosphor layer is directly formed on the LED chip, the high temperature between 100° C. and 150° C. during the operation of the LED chip gradually degrades and affects the conversion efficiency of the phosphor layer.

Remote phosphor is developed to solve the problem of conformal coating described above. The phosphor layer of the light-emitting device with remote phosphor is apart from the LED chip to avoid the light emitted from the phosphor layer being directly absorbed by the LED chip. In the method of remote phosphor, the phosphor of the phosphor layer is less susceptible to degradation under the high temperature operation of the LED chip.

The phosphor absorbs the light emitted from the LED chip and is excited to emit a light having a wavelength different from that of the light emitted from the LED chip. But the light emitted from the phosphor emits towards all directions, including the inward direction, and that reduces the luminous efficiency of the light-emitting device.

SUMMARY OF THE APPLICATION

In accordance with an embodiment of the present application, a wavelength conversion structure comprises a first phosphor layer comprising a plurality of first phosphor particles; and a second phosphor layer formed on the first phosphor layer comprising a plurality of second phosphor particles, wherein the average particle size of the second phosphor particles is not equal to that of the first phosphor particles.

In accordance with an embodiment of the present application, a manufacturing method of a wavelength conversion structure comprises forming a first phosphor layer comprising a plurality of first phosphor particles; and forming a second phosphor layer comprising a plurality of second phosphor particles on the first phosphor layer, wherein the average particle size of the second phosphor particles is not equal to that of the first phosphor particles.

In accordance with an embodiment of the present application, a light-emitting device comprises a support substrate; a light-emitting element formed on the support substrate; and a wavelength conversion structure formed on the light-emitting element, wherein the wavelength conversion structure comprises a first phosphor layer and a second phosphor layer formed on the first phosphor layer, wherein the first phosphor layer comprises a plurality of first phosphor particles and the second phosphor layer comprises a plurality of second phosphor particles, wherein the average particle size of the second phosphor particles is not equal to that of the first phosphor particles.

DETAILED DESCRIPTION OF PREFERRED EMBODIMENTS

Figure 1:
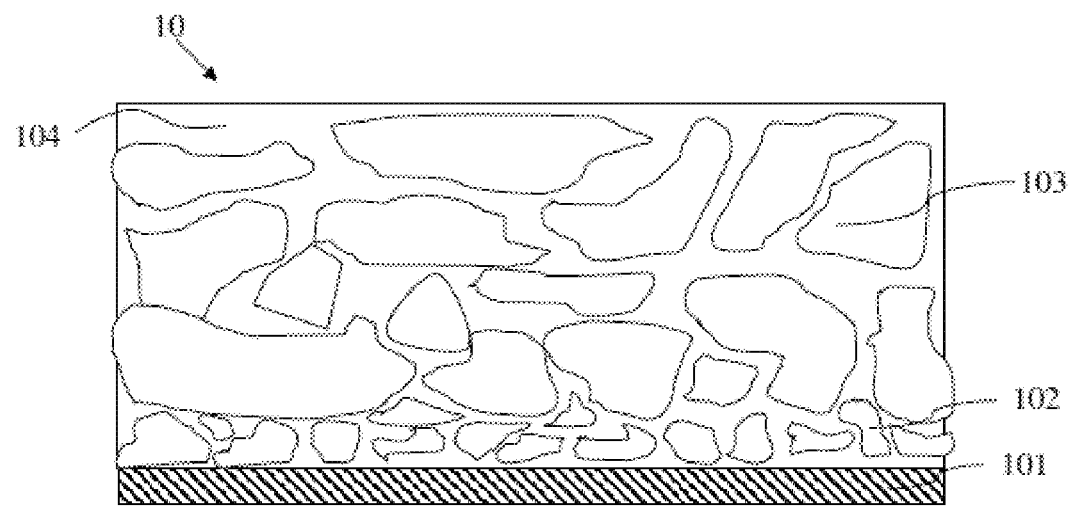
FIG. 1 illustrates a cross-sectional diagram of a wavelength conversion structure in accordance with an embodiment of the present application.

The embodiment of the application is illustrated in detail, and is plotted in the drawings. The same or the similar part is illustrated in the drawings and the specification with the same number.

It should be noted that an expression of an element or a material layer being formed or connected to another element or another material layer comprises the element or the material layer being directly or indirectly formed or connected to another element or another material layer, that is to say other elements or material layers can be formed there between. If the present application describes an element or a material layer being directly formed or connected to another element or material layer, that is to say no other elements or material layers are formed there between.

FIG. 1 illustrates a cross-sectional diagram of a wavelength conversion structure in accordance with an embodiment of the present application. The wavelength conversion structure 10 comprises a conductive substrate 101, a first phosphor layer 102, a second phosphor layer 103, and a glue layer 104. The first phosphor layer 102 comprising a plurality of first phosphor particles and voids formed between the first phosphor particles is formed on the conductive substrate 101. The second phosphor layer 103 comprising a plurality of second phosphor particles and voids formed between the second phosphor particles is formed on the first phosphor layer 102. The glue layer 104 is formed by filling glue materials in the voids formed between the first phosphor particles of the first phosphor layer 102 and the second phosphor particles of the second phosphor layer 103.

The conductive substrate 101 is a transparent conductive substrate. The material of the conductive substrate 101 comprises, but is not limited to, transparent conductive metal oxide (TCO). The first phosphor layer 102 comprising the first phosphor particles is formed on the conductive substrate 101. The material of the first phosphor layer 102 comprises, but is not limited to, yellow ceramic phosphor. The average particle size of the first phosphor particles is between 225 nm and 275 nm, and voids are formed between the first phosphor particles.

The thickness of the first phosphor layer 102 is approximately 1.5 to 4 times the average particle size of the first phosphor particles. Taking the first phosphor particles having average particle size of 225 nm as an example, the minimum thickness of the first phosphor layer 102 is approximately 337 nm. The second phosphor layer 103 comprising the second phosphor particles is formed on the first phosphor layer 102. The material of the second phosphor layer 103 comprises, but is not limited to, yellow ceramic phosphor. The ratio of the average particle size of the second phosphor layer 103 and the average particle size of the first phosphor layer 102 is between 3:1 and 5:1. Taking the first phosphor particles having average particle size of 225 nm as an example, the average particle size of the second phosphor layer 103 is between 675 nm and 1125 nm, and voids are formed between the second phosphor particles.

The glue layer 104 is formed by filling glue materials in the voids of the first phosphor layer 102 and the second phosphor layer 103. The material of the glue layer 104 comprises silicone, and the refractive index of silicone is approximately 1.45. In another embodiment of the present application, the material of the glue layer 104 comprises glass having the refractive index between 1.5 and 1.9, resin having the refractive index between 1.5 and 1.6, titanium oxide ($TiO_2$) having the refractive index between 2.2 and 2.4, silicon oxide ($SiO_2$) having the refractive index between 1.5 and 1.7, and magnesium fluoride (MgF) having the refractive index of approximately 1.38.

In an embodiment of the present application, the thickness of the glue layer 104 is equal to the total thickness of the thickness of the first phosphor layer 102 and that of the second phosphor layer 103. In another embodiment, the thickness of the glue layer 104 is larger than the total thickness of the thickness of the first phosphor layer 102 and that of the second phosphor layer 103. The top surface of the glue layer 104 is higher than the top surface of the second phosphor layer 103, and that provides a flat surface of the wavelength conversion structure 10.

The material of the glue layer 104 is transparent. The glue layer 104 comprises organic compound or inorganic compound having the refractive index between 1.3 and 2.4. The inorganic compound comprises transparent metal oxide. Inorganic compound such as metal oxide has the refractive index approximately similar to that of the phosphor. Because the difference of refractive index between the metal oxide and the phosphor is reduced, the loss of the light efficiency caused by total internal reflection and the light scattering between the phosphors are reduced. In another embodiment of the present application, the inorganic compound comprises glass having the refractive index between 1.5 and 1.9, titanium oxide ($TiO_2$) having the refractive index between 2.2 and 2.4, silicon oxide ($SiO_2$) having the refractive index between 1.5 and 1.7, and magnesium fluoride (MgF) having the refractive index of approximately 1.38. In another embodiment of the present application, the organic compound comprises resin having the refractive index between 1.5 and 1.6.

Figure 2:
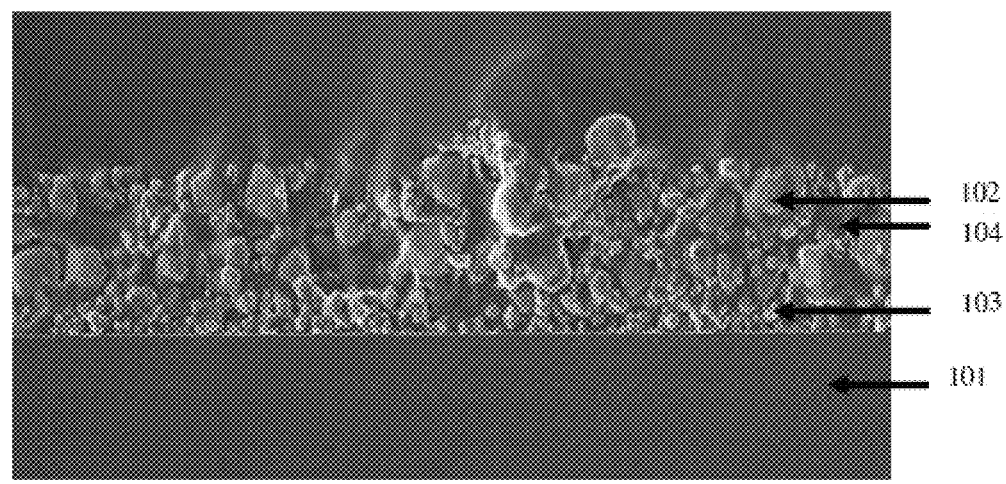
FIG. 2 illustrates an SEM diagram of the wavelength conversion structure.

A fabrication method of the wavelength conversion structure 10 comprises providing the conductive substrate 101 in an electrophoresis apparatus, wherein the conductive substrate 101 can be an ITO glass. The first phosphor layer 102 and the second phosphor layer 103 comprising phosphor are formed on the surface of the ITO glass by electrophoresis. The first phosphor layer 102 and the second phosphor layer 103 comprise a material such as phosphor to convert the wavelength of an incident light. The method for forming the first phosphor layer 102 and the second phosphor layer 103 is not limited to electrophoresis, other method such as gravity depositing can also be used. The material of the glue material can be silicone, and the refractive index is approximately 1.45. In another embodiment, the glue material can be metal oxide, such as ZnO, wherein the refractive index of ZnO is approximately 2. The transparent glue material made of metal oxide, such as ZnO, can be formed in the voids of the first phosphor layer 102 and the second phosphor layer 103 by plating. The transparent oxide having refractive index similar to phosphor is filled in the voids to reduce scattering loss of the light and increase the light extraction. In addition, the metal oxide formed by plating can be an adhesive agent of the phosphor to increase the mechanical strength of the phosphor layer as shown in the SEM diagram of FIG. 2. The forming method of the glue layer 104 is not limited to plating, and comprises chemical vapor deposition (CVD) and sol-gel. The detailed description of sol-gel is used by a person having an ordinary skill in the art, and will not be discussed here. The thickness of the wavelength conversion structure 10 is approximately uniform or non-uniform.

Figure 3:
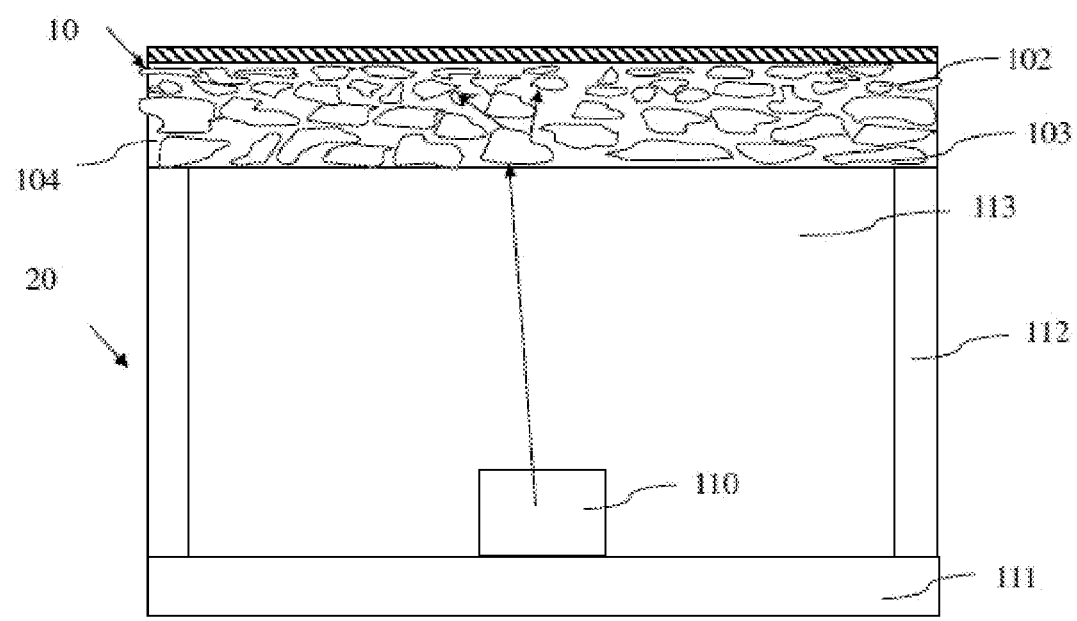
FIG. 3 illustrates a diagram of a light-emitting device in accordance with an embodiment of the present application.

FIG. 3 illustrates a diagram of a light-emitting device in accordance with another embodiment of the present application. The light-emitting device 20 comprises a support substrate 111 and a light-emitting diode 110 formed on the support substrate 111. A light-guide layer 113 covers the support substrate 111 and the light-emitting diode 110. The light-emitting device 20 comprises the wavelength conversion structure 10 described above, wherein the wavelength conversion structure 10 and the light-emitting diode 110 are disposed apart by a supporting element 112, wherein the phosphor is not directly contacted with the light-emitting diode 110 and the light emitted from the phosphor is not directly absorbed by the light-emitting diode 110. Because the phosphor is disposed away the light-emitting diode 110, the phosphor is not easily degraded by the high temperature during the operation of the light-emitting diode 110.

The light-guide layer 113 is a layer for the light to pass through so the light extraction efficiency is improved. In the embodiment, the light-guide layer 113 is a multi-layer stack comprising a plurality of material layers and having gradient refractive index (GRIN). In the embodiment, the multi-layer stack comprises silicon nitride ($Si_3N_4$) having refractive index $n_a$ of 1.95, aluminum oxide ($Al_2O_3$) having refractive index $n_b$ of 1.7, and silicone having refractive index $n_c$ of 1.45. In another embodiment, other material combination can also be used. The total internal reflection of the light is reduced with gradient refractive index of the light-guide layer 113. As the layer of the multi-layer stack is farther from the light-emitting diode 110, the refractive index of the layer is smaller than that of the layer of the multi-layer stack near the light-emitting diode 110. The material combination comprises glass having the refractive index between 1.5 and 1.9, resin having the refractive index between 1.5 and 1.6, diamond like carbon (DLC) having the refractive index between 2.0 and 2.4, titanium oxide ($TiO_2$) having the refractive index between 2.2 and 2.4, silicon oxide ($SiO_2$) having the refractive index between 1.5 and 1.7 and magnesium fluoride (MgF) having the refractive index refractivity of approximately 1.38. In the embodiment, the light-emitting diode 110 can be GaN blue LED chip having refractive index of 2.4. The total internal reflection is reduced by the light-guide layer 113 having gradient refractive index.

In the light-emitting device 20 of the embodiment, the wavelength conversion structure 10 is formed on the light-guide layer 113. The light emits from the light-emitting diode 110, passes through the light-guide layer 113 and proceeds into the wavelength conversion structure 10. The total internal reflection is reduced by the light-guide layer 113 having small refractive index difference between the multi-layer stack. When the light passes through the light-guide layer 113 and proceeds into the wavelength conversion structure 10, the light proceeds into the wavelength conversion structure 10 from a side near the second phosphor layer 103 which acts as a light incident surface, and emits out the wavelength conversion structure 10 from a side near the first phosphor layer 102 which acts as a light emission surface. The light emitted from the light-emitting diode 110 excites the second phosphors of the second phosphor layer 103 to emit a first excited light, and the first excited light proceeds into the first phosphor layer 102, wherein the surface area of the first phosphor particles is larger than that of the second phosphor particles, and the density of the first phosphor particle is smaller than that of the second phosphor particle. When the first excited light proceeds into the first phosphor layer 102, the scattering light destroys the total internal reflection between the conductive substrate 101 and the first phosphor layer 102. When part of the first phosphor particles contacts the conductive substrate 101, the first phosphor particles play a role to roughen the surface of the wavelength conversion structure 10. The light scattering on the rough surface provided by the first phosphor particles reduces the reflection between the interface of the conductive substrate 101 and the first phosphor layer 102, and the light extraction increases.

The light-emitting device 20 is a flat plate package structure. In another embodiment, the conductive substrate 101 of the wavelength conversion structure 10 is not limited to flat plate shape, and the conductive substrate 101 can be convex shape, concave shape or triangular cone shape, that is to say the surface of the conductive substrate comprises flat, curved or concave-convex.

Table 1 illustrates the light extraction comparison data of the light-emitting device 20 having the wavelength conversion structure 10 in accordance with an embodiment of the present application. The wavelength conversion structure 10 comprises (a) a stack structure comprising the first phosphor particles and the second phosphor particles mixed and deposited on the conductive substrate 101, (b) a stack structure comprising the second phosphor layer 103/the first phosphor layer 102/conductive substrate 101 stacked in this order, (c) a stack structure comprising the second phosphor layer 103 formed on the conductive substrate 101, and (d) a stack structure comprising the first phosphor layer 102/the second phosphor layer 103/the conductive substrate 101 stacked in this order. The luminous flux of the wavelength conversion structure 10 comprising the stack structure (b) is 173 lumen. The luminous flux of the wavelength conversion structure 10 comprising the stack structure (b) increases 3~4% compared with other stack structure (a), (c) and (d) as shown in Table 1.

TABLE 1

|  | Luminous flux [Lumen] | radiant flux [W] | color temperature [K] | CIE x | CIE y |
|---|---|---|---|---|---|
| (a) | 166.244 | 0.396993 | 3308.05 | 0.4544 | 0.4873 |
| (b) | 172.897 | 0.439132 | 3368.48 | 0.4430 | 0.4693 |
| (c) | 168.119 | 0.420663 | 3315.75 | 0.4523 | 0.4836 |
| (d) | 167.695 | 0.418150 | 3345.82 | 0.4474 | 0.4765 |

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:
1. A light-emitting device, comprising:
    a light-emitting element;
    a first phosphor layer comprising a plurality of first phosphor particles;
    a second phosphor layer formed between the first phosphor layer and the light-emitting element, wherein the second phosphor layer comprises a plurality of second phosphor particles, the average particle size of the second phosphor particles is larger than that of the first phosphor particles, and the range of the average particle size of the second phosphor particles is between 675 nm and 1375 nm; and
    an inorganic compound formed between the first phosphor particles and/or the second phosphor particles.
2. The light-emitting device as claimed in claim 1, further comprising a conductive substrate provided on one side of the first phosphor layer.
3. The light-emitting device as claimed in claim 1, wherein the average particle size of the second phosphor particles and the average particle size of the first phosphor particles have a ratio between 3:1 and 5:1, and the range of the average particle size of the first phosphor particles is between 225 nm and 275 nm.
4. The light-emitting device as claimed in claim 1, wherein the first phosphor layer and the second phosphor layer comprise yellow phosphor.
5. The light-emitting device as claimed in claim 1, wherein the refractive index of the inorganic compound is between 1.38 and 2.4.
6. The light-emitting device as claimed in claim 1, wherein the thickness of the first phosphor layer is approximately 1.5 to 4 times the average particle size of the first phosphor particles.
7. The light-emitting device as claimed in claim 1, further comprising:
    a support substrate, wherein the light-emitting element is formed on the support substrate; and;
    a light-guide layer between the second phosphor layer and the light-emitting element.
8. The light-emitting device as claimed in claim 7, wherein the light-guide layer comprises a plurality of material layers and has a gradient refractive index.
9. The light-emitting device as claimed in claim 8, wherein the farther the material layer from the light-emitting element, the smaller the refractive index of the material layer is.
10. The light-emitting device as claimed in claim 7, wherein the light-guide layer comprises silicon nitride ($Si_3N_4$), aluminum oxide ($Al_2O_3$), silicone, resin, diamond like carbon, $TiO_2$, $SiO_2$, or MgF.

11. The light-emitting device as claimed in claim 1, wherein the thickness of the first phosphor layer is between 337 nm and 1100 nm.

12. The light-emitting device as claimed in claim 1, wherein the thickness of the second phosphor layer is twice the thickness of the first phosphor layer.

13. A manufacturing method of a light-emitting device, comprising:
    providing a light-emitting element;
    forming a first phosphor layer comprising a plurality of first phosphor particles;
    forming a second phosphor layer between the first phosphor layer and the light-emitting element, wherein the second phosphor layer comprises a plurality of second phosphor particles, the average particle size of the second phosphor particles is larger than that of the first phosphor particles, and the range of the average particle size of the second phosphor particles is between 675 nm and 1375 nm; and
    forming an inorganic compound between the first phosphor particles and/or the second phosphor particles.

14. The manufacturing method of the light-emitting device as claimed in claim 13, further comprising providing a substrate on one side of the first phosphor layer.

15. The manufacturing method of the light-emitting device as claimed in claim 14, wherein the first phosphor layer and/or the second phosphor layer can be formed on the substrate by electrophoresis or gravity deposition.

16. The manufacturing method of the light-emitting device as claimed in claim 13, wherein the inorganic compound comprises glass, metal oxide, or metal fluorides.

17. The manufacturing method of the light-emitting device as claimed in claim 13, wherein forming the inorganic compound comprises plating, chemical vapor deposition (CVD) or sol-gel.

* * * * *